United States Patent
Gupta et al.

(10) Patent No.: US 10,770,158 B1
(45) Date of Patent: Sep. 8, 2020

(54) DETECTING A FAULTY MEMORY BLOCK

(71) Applicant: Western Digital Technologies, Inc., San Jose, CA (US)

(72) Inventors: Mahim Gupta, San Jose, CA (US); Rohit Sehgal, San Jose, CA (US); Rohan Dhekane, San Jose, CA (US); Niles Yang, San Jose, CA (US); Aaron Lee, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/412,657

(22) Filed: May 15, 2019

(51) Int. Cl.
G11C 16/06 (2006.01)
G11C 16/34 (2006.01)
G11C 29/00 (2006.01)
G11C 29/24 (2006.01)
G11C 29/44 (2006.01)

(52) U.S. Cl.
CPC ............. *G11C 16/349* (2013.01); *G11C 29/24* (2013.01); *G11C 29/44* (2013.01); *G11C 29/76* (2013.01)

(58) Field of Classification Search
CPC ....... G11C 16/349; G11C 29/24; G11C 29/44; G11C 29/76
See application file for complete search history.

(56) References Cited

U.S. PATENT DOCUMENTS

| 2008/0082736 | A1* | 4/2008 | Chow | G06F 12/0246 711/103 |
| 2016/0163393 | A1* | 6/2016 | Liang | G11C 16/349 365/185.12 |
| 2018/0102174 | A1* | 4/2018 | Lin | H01L 23/3171 |

* cited by examiner

Primary Examiner — Uyen Smet
(74) Attorney, Agent, or Firm — Dickinson Wright PLLC; Steven Hurles

(57) ABSTRACT

Detecting a faulty memory block. Various methods include: performing a read operation on a memory block of the memory array, the read operation generates a failed bit count; determining the failed bit count in above a value associated with an overall failed bit count; determining the failed bit count is above a threshold value; in response, performing a confirmation process on the memory block, the confirmation process defining a number of consecutive erase cycles and a level of an erase cycle, the confirmation process results in erase pass or erase fail; and marking the memory block for garbage collection in response to determining the confirmation process results in erase fail. Methods additionally include setting the level of the erase cycle by modifying at least one selected form the group comprising: an erase voltage parameter; an erase verify parameter; and a number of bits ignored during the erase cycle.

16 Claims, 8 Drawing Sheets

STEP 2: PERFORM CONFIRMATION FLOW ON IDENTIFIED SUSPECT BLOCK

US 10,770,158 B1

DETECTING A FAULTY MEMORY BLOCK

BACKGROUND

Non-volatile memory systems retain stored information without requiring an external power source. One type of non-volatile memory that is used ubiquitously throughout various computing devices and in stand-alone memory devices is flash memory. For example, flash memory can be found in a laptop, a digital audio player, a digital camera, a smart phone, a video game, a scientific instrument, an industrial robot, medical electronics, a solid state drive, and a USB drive.

Flash memory can experience various failure modes caused by various issues rooted either in the hardware or software configuration of the flash memory. Some failures can be corrected with error correction code, while other type of errors, such as those caused by shorts, are more difficult to correct. Indeed, some types of failures progressively continue to get worse as the flash memory ages.

SUMMARY

Various embodiments include a storage system, configured to detect a faulty block in a memory array during operation of the storage system, including: the memory array; and a controller coupled to the memory array, where the controller is configured to: perform a read operation on a memory block of the memory array, where the read operation generates a failed bit count. The controller is further configured to determine the failed bit count is above a value associated with an overall failed bit count; and determine the failed bit count is above a threshold value. In response to determining the failed bit count is above a threshold value, the controller is further configured to perform a confirmation process on the memory block, the confirmation process defining a number of consecutive erase cycles and a level of an erase cycle where the confirmation process results in erase pass or erase fail; and mark the memory block for garbage collection in response to determining the confirmation process results in erase fail Other embodiments include a method for detecting a faulty block in a memory system during operation of the memory system, including: performing a read operation on a memory block, where the read operation generates a failed bit count; determining the failed bit count is above a threshold value; in response, performing a confirmation process on the memory block, the confirmation process defining a level of an erase cycle, the confirmation process results in erase pass or erase fail; and marking the memory block for garbage collection in response to determining the confirmation process results in erase fail.

Other embodiments include a memory controller, including: a first terminal configured to couple to a memory array, the memory controller configured to: perform a read operation on a memory block, the read operation generates a failed bit count; determine the failed bit count is above a threshold value; in response, perform a confirmation process on the memory block. The confirmation process defines a level of an erase cycle, the confirmation process results in erase pass or erase fail. The memory controller is further configured to mark the memory block for garbage collection in response to determining the confirmation process results in erase fail.

BRIEF DESCRIPTION OF THE DRAWINGS

For a detailed description of example embodiments, reference will now be made to the accompanying drawings in which.

DETAILED DESCRIPTION

Figure 1:
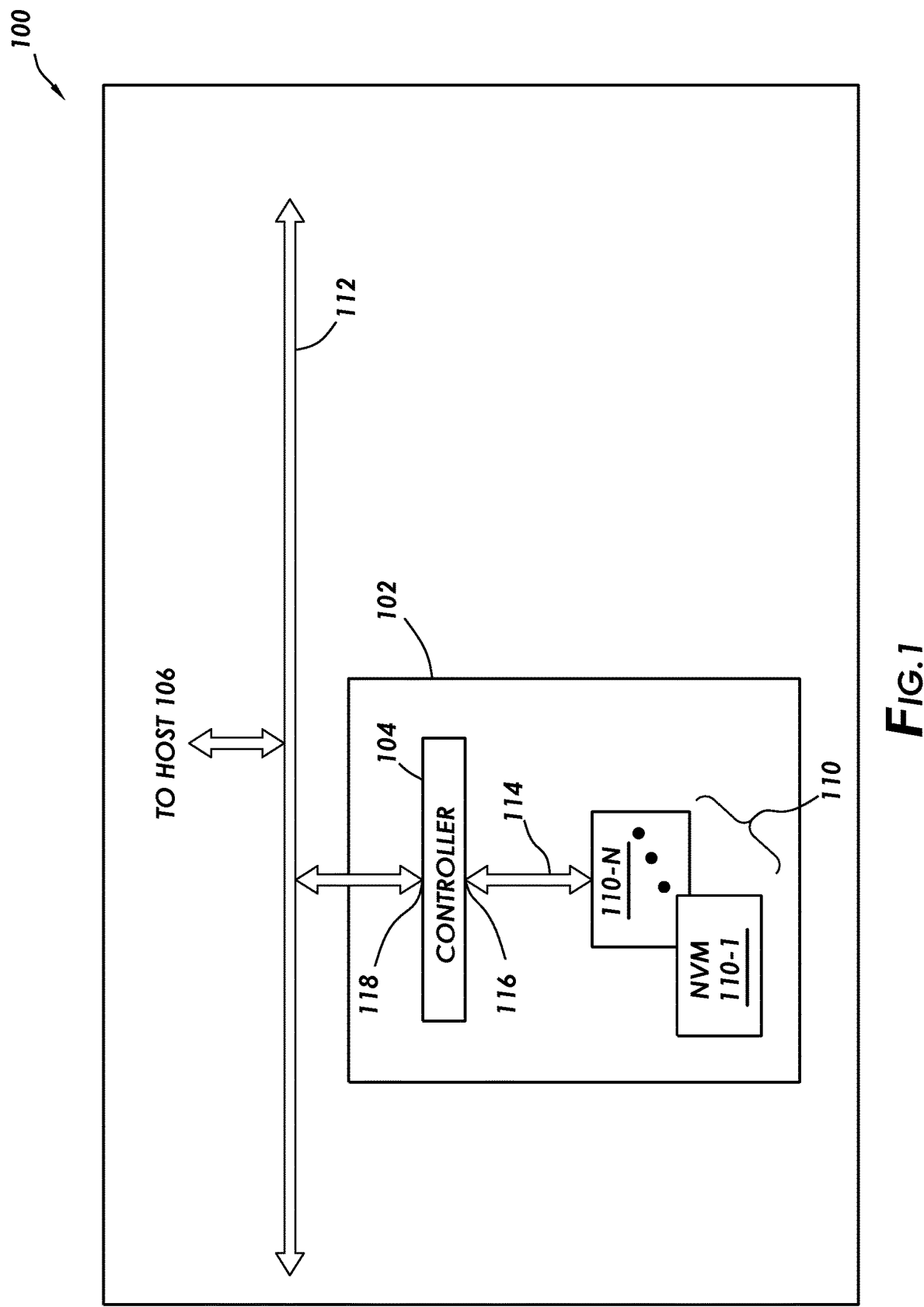
FIG. 1 illustrates a block diagram of an example non-volatile memory system, in accordance with some embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. References to a controller shall mean individual circuit components, an application-specific integrated circuit (ASIC), a microcontroller with controlling software, a digital signal processor (DSP), a processor with controlling software, a field programmable gate array (FPGA), or combinations thereof.

At least some of the example embodiments are directed to a storage system, configured to detect a faulty block in a memory array during operation of the storage system, including: the memory array; and a controller coupled to the memory array, where the controller is configured to: perform a read operation on a memory block of the memory array, the read operation generates a failed bit count; determine the failed bit count is above a value associated with an overall failed bit count; determine the failed bit count is above a threshold value; in response, perform a confirmation process on the memory block, the confirmation process defining a number of consecutive erase cycles and a level of an erase cycle. The confirmation process results in erase pass or erase fail; and the controller is further configured to mark the memory block for garbage collection in response to determining the confirmation process results in erase fail.

The consecutive erase cycles are performed on the memory block in an effort to identify memory blocks that have a targeted type of short, described further below. Specific laboratory tests have demonstrated that when a memory block includes the targeted type of short, the targeted type of short starts out as a weak short that gradually becomes a stronger short as the cycle count (e.g., program/erase cycle) increases on the memory block. The failed bit count associated with reads on the memory block also gradually increases as the targeted type of short becomes stronger as the cycle count on the memory block increases. Furthermore, evidence has shown that performing erase only cycling on a memory block with the targeted type of short results in accelerating the degradation of the memory block as the targeted type of short becomes stronger with the erase only cycling.

The targeted type of short cannot be remedied using known error correction schemes such as XOR. Nor is it practical to test for and sort out memory die with the targeted type of short during die sort or during stress testing performed before the memory leaves the factory. Attempts to sort out these memory die with the targeted type of short can result in prematurely sorting out memory die that is otherwise good. Thus, methods disclosed herein are performed when a memory system is being used by an end-user.

Accordingly, methods are performed during operation of the memory system, that include performing a read operation on a memory block, identifying a suspect memory block based on a failed bit count encountered during the read operation, and performing a confirmation process on the memory block to confirm the presence of the targeted type of short.

FIG. 1 illustrates a block diagram of an example system architecture 100 including non-volatile memory 110. In particular, the example system architecture 100 includes storage system 102, a controller 104 communicatively coupled to a host 106 by a bus 112. The bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, or Advanced Microcontroller Bus Architecture (AMBA).

The controller 104 has at least a first port 116 coupled to a non-volatile memory ("NVM") 110, hereinafter "memory 110" by way of a communication interface 114. The memory 110 is disposed within the storage system 102. The controller 114 couples the host 106 by way of a second port 118 and the bus 112. The first and second ports 116 and 118 of the controller can include one or several channels that couple the memory 110 or the host 106, respectively.

The memory 110 of the storage system 102 includes several memory die 110-1-110-N. The manner in which the memory 110 is defined in FIG. 1 is not meant to be limiting. In some embodiments, the memory 110 defines a physical set of memory die, such as the memory die 110-1-110-N. In other embodiments, the memory 110 defines a logical set of memory die, where the memory 110 includes memory die from several physically different sets of memory die. The memory die 110 include non-volatile memory cells that retain data even when there is a disruption in the power supply. Thus, the storage system 102 can be easily transported and the storage system 102 can be used in memory cards and other memory devices that are not always connected to a power supply.

In various embodiments, the memory cells in the memory die 110 are solid-state memory cells (e.g., flash), one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash).

Still referring to FIG. 1, the controller 104 and the memory 110 are communicatively coupled by an interface 114 implemented by several channels (e.g., physical connections) disposed between the controller 104 and the individual memory die 110-1-110-N. The depiction of a single interface 114 is not meant to be limiting as one or more interfaces can be used to communicatively couple the same components. The number of channels over which the interface 114 is established varies based on the capabilities of the controller 104. Additionally, a single channel can be configured to communicatively couple more than one memory die. Thus the first port 116 can couple one or several channels implementing the interface 114. The interface 114 implements any known or after developed communication protocol. In embodiments where the storage system 102 is flash memory, the interface 114 is a flash interface, such as Toggle Mode 200, 400, or 800, or Common Flash Memory Interface (CFI).

In various embodiments, the host 106 includes any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Although, the storage system 102 includes its own memory controller and drivers (e.g., controller 104)—as will be described further below in FIG. 2A—the example described in FIG. 1 is not meant to be limiting. Other embodiments of the storage system 102 include memory-only units that are instead controlled by software executed by a controller on the host 106 (e.g., a processor of a computing device controls—including error handling of—the storage unit 102). Additionally, any method described herein as being performed by the controller 104 can also be performed by the controller of the host 106.

In various embodiments, the controller 104 serves as an interface between the host 106 and the storage system 102 and manages data stored on the storage system 102. The controller 104 can include individual circuit components, processing circuitry (e.g., logic gates and switches), a processor, a microprocessor, a microcontroller with controlling software, or a field programmable gate array (FPGA). The example controller 104 can include a computer-readable medium that stores computer-readable program code (e.g., software or firmware) executable by a processor. In some embodiments, the controller 104 is a flash memory controller. In other embodiments, the functionality of the controller 104 is implemented by a processor executing within the host 106.

Still referring to FIG. 1, the host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106. In one example, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106. In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Thus, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling, modified XOR operations).

Additional details of the controller 104 and the memory 110 are described next in FIGS. 2A and 2B. Specifically, FIG. 2A shows, in block diagram form, additional details with respect to the controller 104 (introduced in FIG. 1A) of the storage system 102. FIG. 2A illustrates previously described controller 104, memory 110 and ports 116 and 118. Additionally, the storage system 102 includes a random access memory (RAM) 230, a read only memory (ROM) 232 respectively coupled to the controller 104 by a RAM port 272 and a ROM port 274.

Although the RAM 230 and the ROM 232 are shown as separate modules within the storage system 102, the illustrated architecture is not meant to be limiting. For example, the RAM 230 and the ROM 232 can be located within the controller 104. In other cases, portions of the RAM 230 or ROM 232, respectively, can be located outside the controller 104. In other embodiments, the controller 104, the RAM 230, and the ROM 232 are located on separate semiconductor die. The discussion now turns to the various example modules included within the controller 104.

The following discussion of the various modules depicted within the controller 104 are meant to be illustrative and not limiting as to the architecture of the controller 104. For example, the various modules described in FIG. 2A are not limited to being executed within the controller 104; one or more modules can be executed outside the controller 104. The various modules can be combined within the controller and can include optional modules implemented within the controller. As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combinations thereof. In other embodiments, a module can include memory that stores instructions executable by a controller to implement a feature of the module. Thus, the controller can be configured with hardware and/or firmware to perform the various functions described herein.

The modules within the controller (e.g., modules 202 and 204) are communicatively coupled to each other by a bus 206. The module 202 interfaces with the host 106 and includes a host interface 208 and a physical layer interface 210 that provides the electrical interface between the host 106 or next level storage controller and the controller 104. The host interface 208 facilitates transfer of data, control signals, and timing signals. Examples of the host interface 208 include SATA, SATA express, Serial Attached SCSI (SAS), Fibre Channel, USB, PCIe, and NVMe.

Figure 2A:
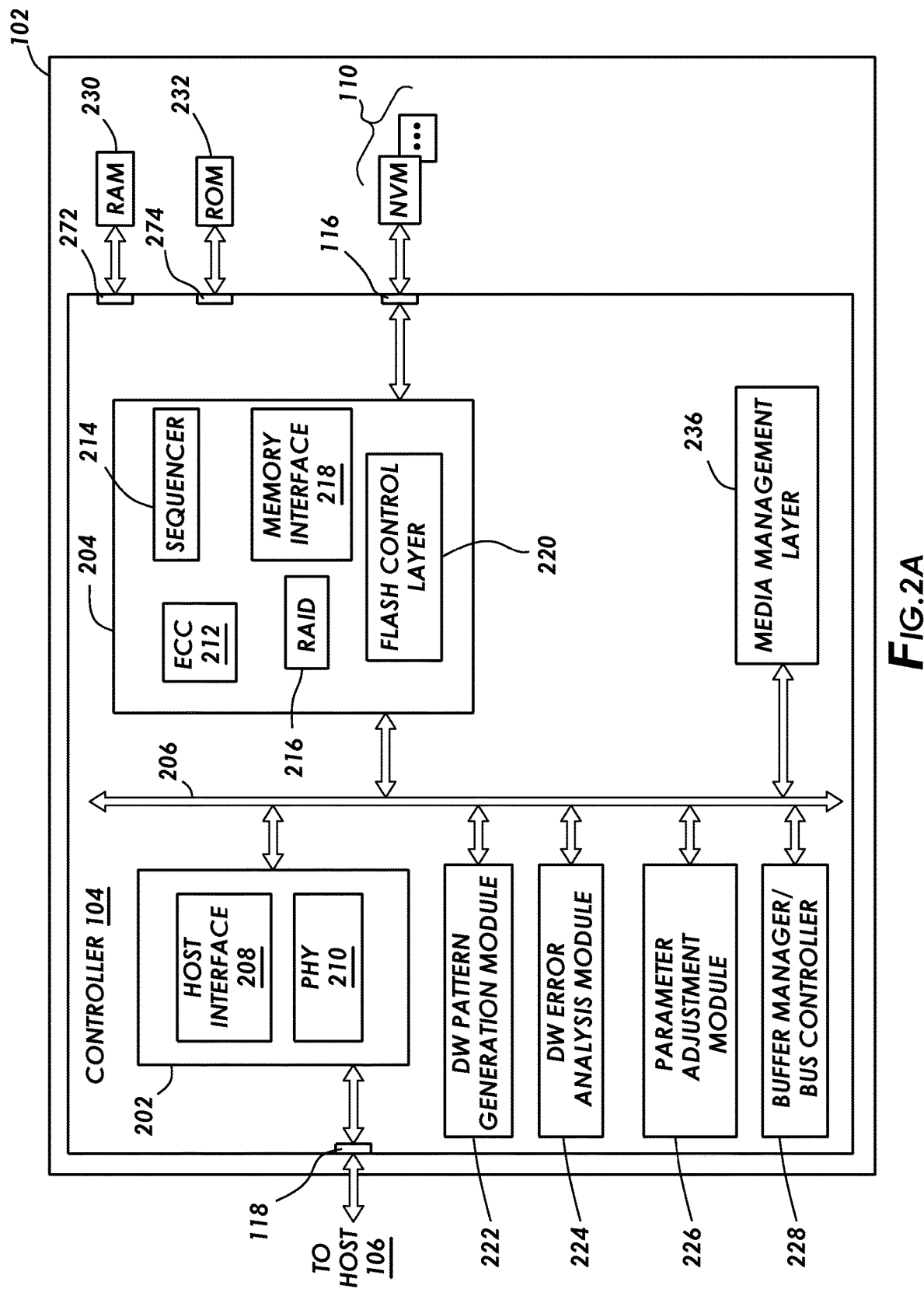
FIG. 2A illustrates a block diagram of example components of a controller, in accordance with some embodiments.

Still referring to FIG. 2A, the module 204 is configured to communicate with the memory 110, by way of port 116, and includes an error correcting code (ECC) engine 212, a sequencer 214, a Redundant Array of Independent Drives (RAID) module 216, a flash control layer 220, and a memory interface 218. In some embodiments, the ECC engine 212 encodes host data received from the host 106 and stores the encoded host data in the memory 110. When the host data is read out from the memory 110, the ECC engine 212 decodes the host data and corrects errors detected within the host data. In various embodiments, the sequencer 214 generates command sequences, such as program and erase command sequences that are transmitted to the memory 110.

The RAID module 216 generates RAID parity and recovery of failed data. The RAID parity can be used to provide an additional level of integrity protection for data written into the memory 110. In some embodiments, the ECC engine 212 implements the functions of the RAID module 216.

The memory interface 218 provides command sequences to the memory 110 and receives status information from the memory 110. For example, the memory interface 218 implements any known or after developed communication protocol including a double data rate (DDR) interface, such as a Toggle Mode 200, 400, or 800 interface. The flash control layer 220 controls the overall operation of the module 204.

Still referring to FIG. 2A, additional modules within the controller 104 include a dummy word line (DW) pattern generation module 222, a DW error analysis module 224, and a parameter adjustment module 226. In various embodiments, the DW pattern generation module 222 puts a known data pattern into a dummy word line and tracks or periodically check for errors by reading the data back out of the dummy word line and comparing the data to the known data pattern. In various embodiments, the parameter adjustment module 226 adjusts parameters associated with a particular non-volatile memory die or more specifically a particular memory block.

For example—and as discussed further below—the parameter adjustment module 226 can adjust the parameters associated with a particular block including, erase, program, and read parameters. In accordance with methods described herein, during a confirmation process, the parameter adjustment module 226 modifies the erase parameters associated with a respective block, based on various parameters. During the confirmation process, the erase parameters associated with the memory block are subsequently used to perform consecutive erase cycles on the memory block.

The example controller 104 includes a buffer manager/bus controller 228 that manages, for example, buffers in the RAM 230 and controls the internal bus arbitration of the bus 206 in the controller 104. Additionally, the example controller 104 includes a media management layer 236 that performs wear leveling of the memory 110. In embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the memory 110. Accordingly, modules and components within an example controller 104 have been described.

Figure 2B:
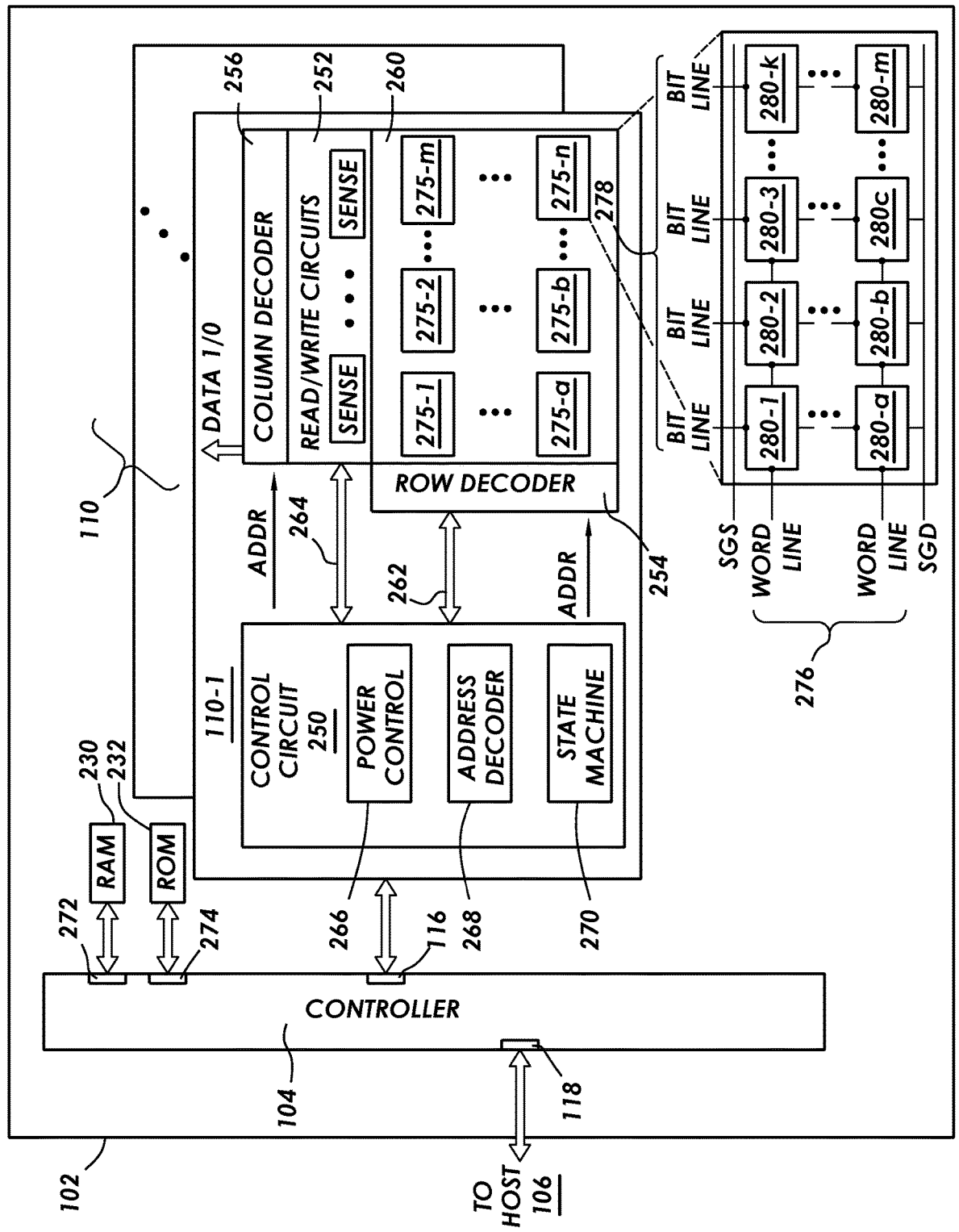
FIG. 2B illustrates a block diagram of example components of a non-volatile memory storage system, in accordance with some embodiments.

FIG. 2B shows in block diagram form, various features and an example layout of the memory 110 within the storage system 102. In order to orient the reader, previously described controller 104, RAM 230, and the ROM 232, are included in FIG. 2B. Although the discussion in FIG. 2B centers on the memory die 110-1, each of the features discussed in relation to the memory die 110-1 equally applies to all the memory die within the memory 110.

In various embodiments, the example memory die 110-1 includes control circuit 250, read/write circuits 252, a row decoder 254, a column decoder 256, and a memory array 260. The example control circuit 250 includes a power control circuit 266, an address decoder 268, and a state machine 270. In some embodiments, the power control circuit 266, the address decoder 268, and the state machine 270 are collectively referred to herein as "managing circuits." The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading or writing to the memory cells by way of the row decoder 254 and the column decoder 256. In some embodiments, the read/write circuits 252 are configured to read and program pages of memory within the memory die 110-1 in parallel.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256 and vice versa. The state machine 270 provides chip-level control of memory operations.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

Still referring to FIG. 2B, the example memory array 260 includes several memory blocks 275, arranged as a two-dimensional array. For sake of example, the memory block 275-n is further detailed using dashed lines. The example memory block 275-n includes a two-dimensional array of memory cells 280, arranged in an array of rows and columns. Respective columns of memory cells 280 are coupled to respective bit lines 278, and respective rows of memory cells 280 are coupled to a respective word line 276. Additionally, each of the columns of memory cells 280 is coupled to a select gate drain (SGD) and a select gate source (SGS) lines.

Throughout the lifetime of the storage system 102, the storage system 102 can encounter various failure modes caused by various defects that can include: wafer process defects; handling; electrical overstress, electrostatic discharge; design related defects; process errors; design and test; and assembly defects. In particular, the wafer process defects occur during manufacturing of the memory 110 and further can include particle defect related failures. Some example wafer process defects include: a short between word lines (e.g., metal-to-metal leakage); leakage between a word line 276 and a bit line 278; defects in peripheral circuitry (e.g., control circuit 250); a defect in the silicon substrate; defective tunnel oxide; and a particle defect within the vicinity of the floating gate of a memory cell (e.g., memory cell 280).

Figure 3:
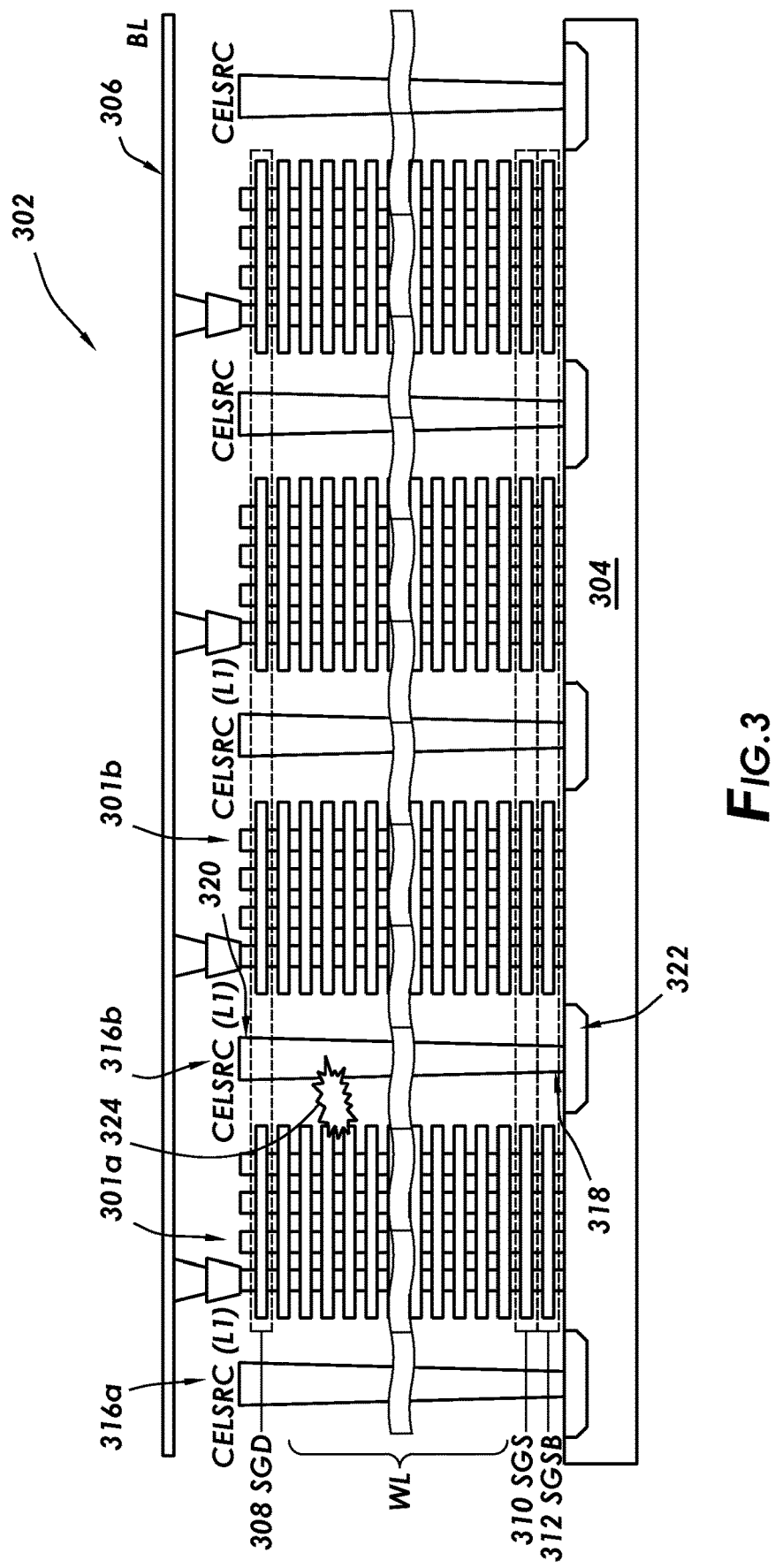
FIG. 3 illustrates a block diagram of a three dimensional (3D) memory array, in accordance with some embodiments.

With regards to 3D NAND, wafer process defects can include a short between a word line and a local interconnect ("LI") line. FIG. 3 illustrates a 3D NAND 302, in accordance with various embodiments. As shown in FIG. 3, one or more memory device levels are formed on a single substrate 304. The memory device levels form multiple blocks or structures (e.g., structures 301a and 301b). For the sake of this discussion, a bottom part of the 3D NAND 302 is proximal to the substrate 304 while a top part of the 3D NAND 302 is distal from the substrate 304. Memory cells within the respective structures are coupled to global bit lines 306, which run along the top part of the 3D NAND 302. Additionally, global select lines 308, 310, and 312 span the multiple structures and connect to the sources of the memory cells, which in turn are connected by a local interconnect (e.g. "LI" 316a). The LI such as LI 316a run vertically between the global bit line 306 and the substrate 304, and are disposed between respective structures 301.

Ideally, a structural shape of the local interconnect, LI 316 resembles a perfect cylinder, defined by two bases that are congruent and parallel to each other. However, due to processing limitations related to devices manufactured within the nanometer scale, a structural shape of the LI 316 can instead resemble a tapered cylindrical shape, defined by a first base that is not congruent to the second base. For example as illustrated in FIG. 3, the LI 316b defines a first base 318 and a second base 320, where the first base 318 couples an n+ well 322 formed within the substrate 304, while the second base 320 is proximal to the top part of the 3D NAND 302. A diameter of the first base 318 is smaller than a diameter of a second base 320. Thus, the example LI 316b tapers such that a diameter of the LI 316b increases gradually from the first base 318 to the second base 320. Thus, a distance between the structural shape of the LI 316b and adjacent word lines decreases near the top part of the 3D NAND 302. In some embodiments, due to processing limitations or defects, a weak short (e.g., short 324) forms between a word line and the LI 316b.

Shorts such as the short 324 in 3D NAND 302 as well as other shorts formed in planar memory (e.g., FIG. 2B), can demonstrate a type of failure mode in which—as the cycle count increases on the memory block (e.g., number of program/erase cycles), the short 324 becomes stronger. The failed bit count associated with reads on the memory block also gradually increases as the short 324 becomes stronger as the cycle count on the memory block increases. In various embodiments, drive level testing performed on memory 110 with the target type of short have shown that with increased cycling of the drive, the short can become stronger eventually resulting in an uncorrectable error (e.g., UECC on all word lines). Furthermore, drive level testing has confirmed that erase only stress (e.g., erase only cycling) can accelerate this phenomenon associated with this failure mode. That is, stress on the memory block induced by erase only cycling results in the failed bit count on the memory block gradually increasing.

As the short becomes stronger and as the failed bit count increases, eventually the failed bit count associated with the memory block surpasses a capacity of the error correction code engine to recover data. Thus, eventually, an attempted read of data on the memory block results in an uncorrectable error. Shorts demonstrating this type of a failure mode are referred to herein as "targeted type of short". Embodiments described herein are directed to identifying memory blocks including the targeted type of short and marking those memory blocks as faulty.

A memory controller performs a confirmation process on a memory block to affirmatively confirm a memory block includes the targeted type of short. Prior to performing the confirmation process, the memory controller identifies a suspect memory block using methods described herein. Upon confirming a suspect memory block includes the targeted type of short, the memory controller marks the memory block as faulty (e.g., marks the block for garbage collection). Otherwise, if the suspect memory block does not include the targeted type of short, the controller continues with normal operation of the memory block.

Although other error correction mechanisms are available to the storage system 102, such as XOR schemes, such mechanisms can recover data when a limited number of shorts are present (e.g., two word lines in a memory block). However, error correction mechanisms, such as XOR schemes, cannot recover data when a block level failure occurs (e.g., all word lines are failing). Other mechanisms can include screening memory die during sort, memory testing, and other manufacturing and post manufacturing steps, however such mechanisms are ineffective during operation and use of the memory 110. Furthermore, attempting to screen for the targeted type of short—during die sort or memory testing—can lead to rejection of entire memory die that include some bad memory blocks and some good memory blocks. Through the use of the confirmation flow, the controller mitigates a known block level failure before it occurs on the drive and retires such blocks by applying an intelligent dynamic failed bit count ("FBC") monitor.

Figure 4A:
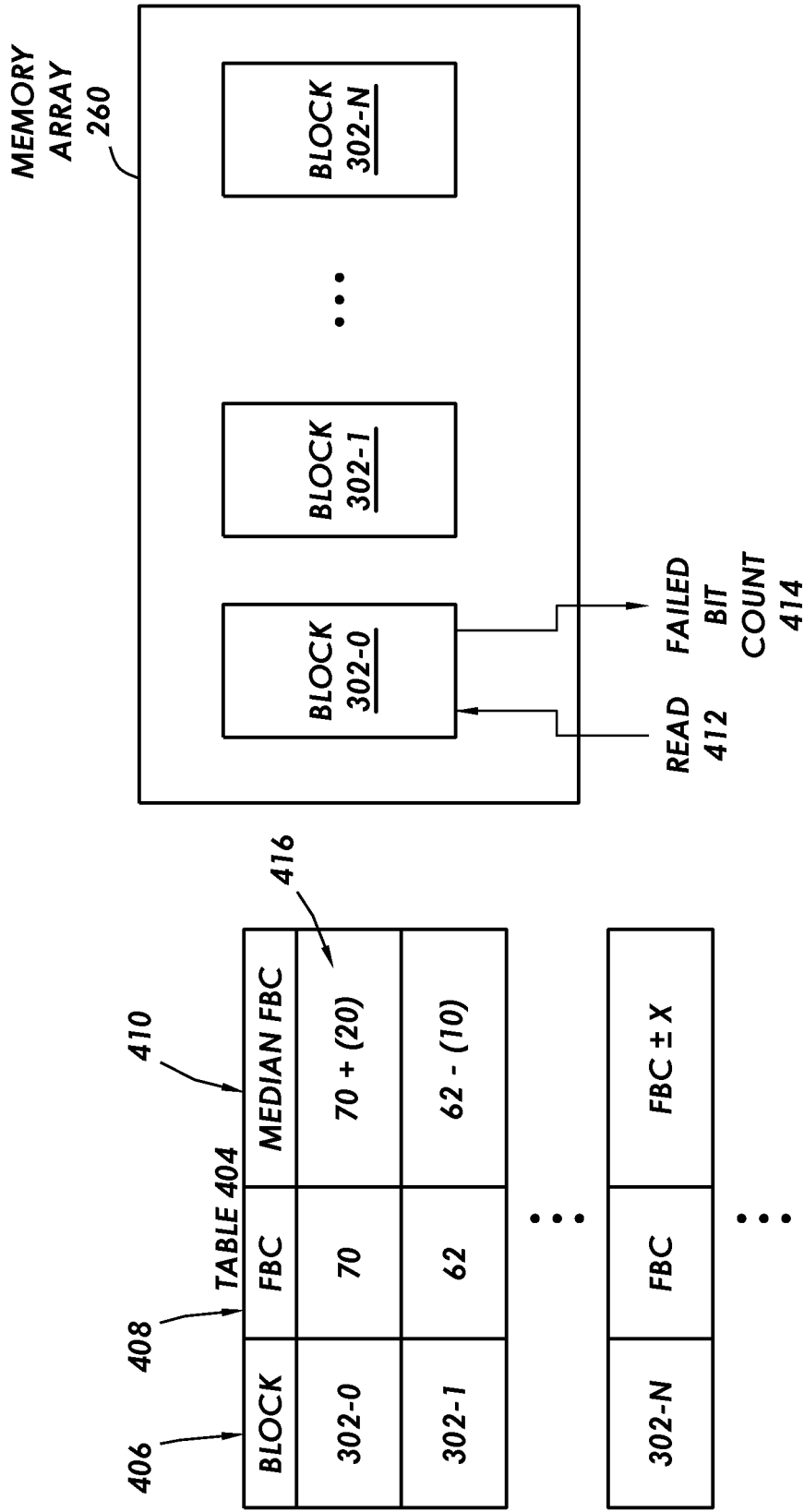
FIG. 4A illustrates a conceptual and method diagram in which the controller identifies a suspect memory block, in accordance with some embodiments.

FIG. 4A illustrates a conceptual and method diagram in which the controller identifies a suspect memory block, in accordance with some embodiments. By way of example, methods performed by the controller 104 are discussed during operation of the memory 110. Specifically, the described methods are not performed during stress testing or other testing performed while memory 110 is in the factory. Rather, the described methods are performed while the memory 110 is being used in the field (e.g., used by a customer). Initially the controller 104, identifies a suspect memory block that exhibits characteristics associated with the targeted type of short. One such characteristic is a gradually increasing failed bit count with increased cycling.

As used herein, a suspect memory block is one that demonstrates a gradually increasing failed bit count with increased cycling, but the memory block has not yet been confirmed to have the targeted type of short. A gradually increasing failed bit count can be caused by phenomenon outside of the targeted type of short. That is, the gradually increasing failed bit count may be caused by failure modes other than the targeted type of short. Accordingly, an identified memory block is a suspect memory block until the confirmation process confirms the suspect memory block has the targeted type of short.

The controller 104 identifies a suspect memory block by using a two-fold comparison that includes: a) comparing the failed bit count to a value associated with an overall failed bit count; and b) comparing the failed bit count to a threshold value. The steps of comparing the failed bit count to a value associated with the overall failed bit count and comparing the failed bit count to a threshold value is used to monitor for a failed bit count gradually increasing as the cycle count increases.

As part of the two-fold comparison, the overall failed bit count is representative of cumulative failed bit counts encountered over the lifetime of the memory block 302-0. The overall failed bit count can include an initial failed bit count. In various embodiments, the memory array 260 initially undergoes stress testing while in the factory. As part of the stress testing, the failed bit count per block is obtained. Additionally, during the stress testing, the median failed bit count as well as a standard deviation value (e.g., variance, a 3-sigma value, or a 4-sigma value) of the failed bit count is also obtained per block. As used herein, the failed bit count obtained during stress testing is referred to herein as an initial failed bit count.

After initial stress testing, once memory 110 is used in the field (e.g., implemented in a disc drive, the controller 104 updates a median failed bit count and a standard deviation value (e.g., variance, a 3-sigma value, or a 4-sigma value) of the cumulative failed bit count of the memory block 302-0. During operation of the memory 110, the median failed bit count associated with the memory block 302-0 can deviate in either direction of the initial failed bit count. For example, the median failed bit count can decrease, stay about the same, or increase as compared to the initial failed bit count. Additionally, the standard deviation value can also vary over the lifetime of the memory 110.

As embodiments herein are directed to the controller 104 accurately detecting a failure mode with a trait that includes a gradually increasing failed bit count, the controller 104 can assess whether the failed bit count is gradually increasing by comparing a current failed bit count and the median failed bit count. Additionally, the controller 104 can assess how far the failed bit count is from the median failed bit count using the standard deviation value (e.g., a sigma value). In some embodiments, a threshold value is defined based on the standard deviation value. Although the example describes the use of a median failed bit count to help identify the existence of a trend in the overall failed bit count, other metrics can be used, for example an average of the cumulative failed bit counts.

In some embodiments, the controller 104 maintains an array or list capturing the failed bit counts encountered during reads performed on a respective memory block in the memory 110. The controller 104 references this array to calculate an updated median failed bit count and standard deviations values. For example, after performing a read on the memory block 302-0, the controller 104 updates the median failed bit count and the standard deviations value (e.g., variance, a 3-sigma value, or a 4-sigma value) associated with the memory block 302-0 in the memory array 260, RAM 230 (FIG. 2A), memory of the host, or some combination thereof.

In the example illustrated in FIG. 4A, the controller 104 tracks the initial failed bit count and the median failed bit count in table 404. Specifically, in table 404, the first column 406 identifies a respective memory block; the second column 408 captures the initial failed bit count obtained during factory tests, for the respective memory blocks; the third column 410 captures the median failed bit count associated with respective memory blocks.

In step 1, the controller 104 performs a read operation (e.g., read 412) on a memory block (e.g., memory block 302-0). During the read operation, a failed bit count associated with the read operation is generated (e.g., failed bit count 414). The controller 104 initially compares the failed bit count 414 to a value associated with an overall failed bit count of the memory block, such as a median failed bit count. In FIG. 4A, an example median failed bit count is 70+20 (e.g., entry 416 in table 404). If the failed bit count 414 is above the median failed bit count 416, this may indicate the memory block is suspect of having the targeted type of short. If the failed bit count 414 is below the median failed bit count 416, this indicates the memory block 302-0 is not suspect of having the targeted type of short.

For sake of example, the controller 104 determines the failed bit count 414 is above the median failed bit count 416, and proceeds to assess whether the failed bit count 414 is above a threshold value. The threshold value represents some measure of distance in value from either an initial failed bit count—obtained during stress testing—or median failed bit count, obtained during the lifetime of the memory 110. In one example, the threshold value is the three sigma value or the four sigma value of the cumulative failed bit counts. In other examples, the threshold value is a standard deviation value based off the initial failed bit count, or a standard deviation value based off the cumulative failed bit count.

If the failed bit count 414 is both above the median failed bit count 416 and above the threshold value, the controller 104 identifies the memory block 302-0 as suspect of having the targeted type of short. If the failed bit count 414 is not above the threshold value, but above the failed bit count 414, the controller 104 may continue to monitor the memory block. In some embodiments, the controller 104 stores the failed bit count 414 in an array or list used to determine an updated median failed bit count. Additionally, the controller 104 can update entry 416 with the updated median failed bit count, wherein the updated median failed bit count accounts for the failed bit count 414.

For the purposes of the example in FIG. 4A, the failed bit count 414 is above the overall failed bit count as well as above the threshold value, and thus the memory block 302-0 is identified as a suspect memory block. Although the example discussed in FIG. 4A illustrates a two-fold comparison, embodiments contemplate using a single comparison step. For example, in one embodiment, the controller 104 decides whether the memory block is a suspect memory block by comparing the failed bit count to a threshold value without comparing the failed bit count to a median failed bit count. In other embodiments, the controller 104 decides whether the memory block is a suspect memory block by comparing the failed bit count to the median failed bit count without comparing the failed bit count to the threshold value.

Accordingly, the controller 104 proceeds to step 2 (FIG. 4B), where the controller 104 performs the confirmation process on the identified suspect memory block 302-0. The confirmation flow is performed to confirm whether the suspect memory block has the targeted type of short. As previously described, the targeted type of short degrades fasters (e.g., the short becomes stronger) with erase only cycling. As also previously mentioned, although a memory block is identified as a suspect memory block, additional steps are undertaken to confirm the presence of the targeted type of short, as there are scenarios other than the targeted type of short that can result in a gradually increasing failed bit count. For these other types of scenarios it may not be appropriate to mark the memory block as faulty.

Figure 4B:
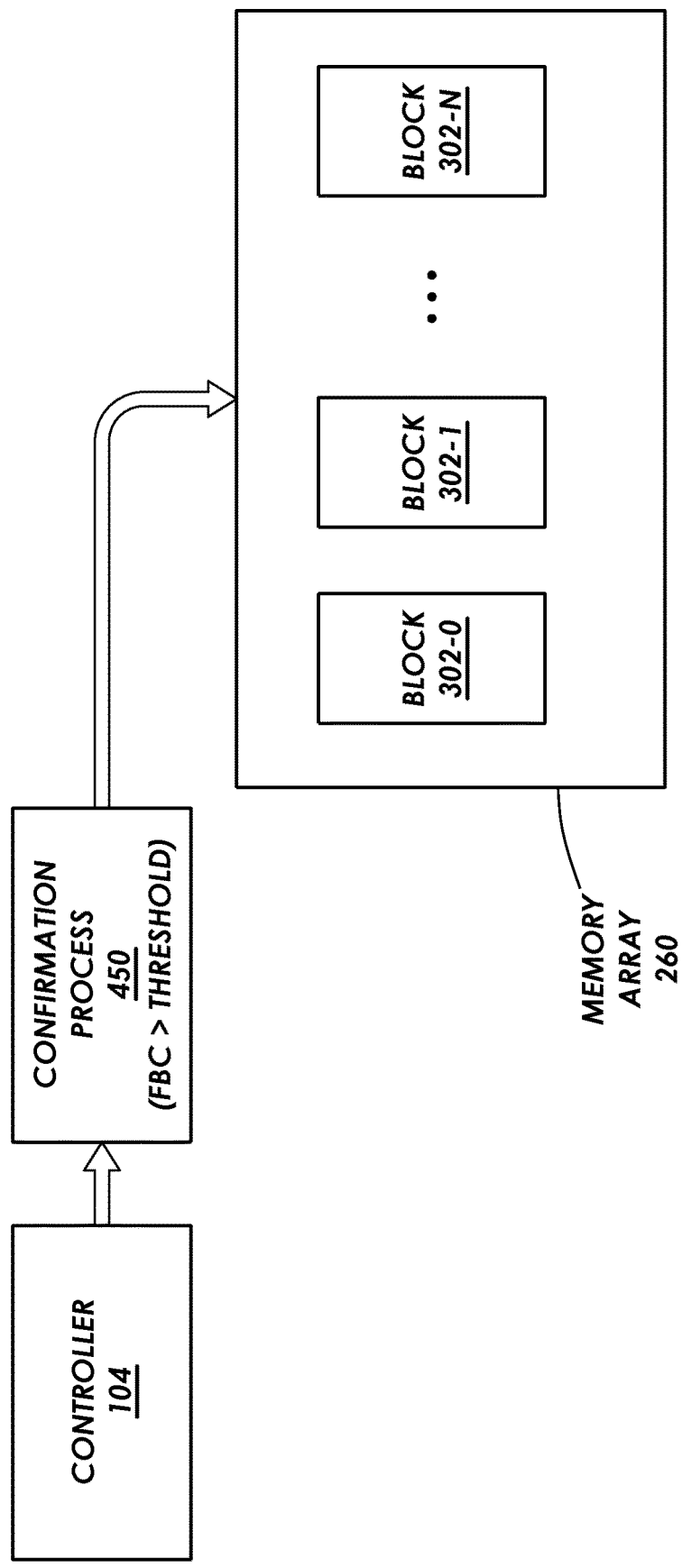
FIG. 4B illustrates a conceptual and method diagram in which a confirmation flow is applied to the suspect memory block, in accordance with some embodiments.

In FIG. 4B, the controller 104 performs the confirmation process 450 on the memory block 302-0. As an initial step, prior to performing the confirmation process 450, the controller 104 relocates data stored in memory block 302-0. The data is relocated as the confirmation process 450 involves performing consecutive erase cycles on the memory block 302-0.

Prior to performing the confirmation process 450, the controller 104 can define the number of consecutive erase cycles to perform as well as a level of the erase cycles. For example, the level of erase cycles can be defined by the controller 104 modifying example parameters related to the erase cycles such as, but not limited to: parameters specific to the erase verify parameter; levels of an erase voltage to be applied during the erase cycles; and bits to be ignored during erase (e.g., BSPF).

Parameters related to the erase verify parameter can include clock timing parameters, the voltage levels used during the verify operation, and the like. The levels of an erase voltage can also include clock timing parameters, the voltage levels used during an erase operation, and the like. Additionally, bits to be ignored during erase include a number of bits that can be ignored when making the determination as to whether the memory block is erased. Similar to how the number of erase cycles can be modified based on the difference in value between the failed bit count 414 and the overall failed bit count (e.g., median failed bit count 410), and the overall cycling of the drive, parameters related to a level of an erase cycle can also be modified based on these factors.

The controller 104 can modify the number of erase cycles as well as the level of the erase cycle based on example factors including: 1) a difference in value between the failed bit count 414 and the overall failed bit count (e.g., median failed bit count 410); 2) overall cycling of the drive; and 3) a result of a write operation.

In one example, the controller 104 sets the number of erase cycles based on a difference in value between the failed bit count 414 and the overall failed bit count. The further away the failed bit count 414 is from the median failed bit count 410, the fewer erase cycles performed by the controller 104 during the confirmation process. Alternatively, the closer the failed bit count 414 is to the median failed bit count 410, the greater the number of erase cycles performed by the controller 104 during the confirmation process. The controller 104 sets the number of erase cycles accordingly because in a memory block that includes the targeted type of short, the higher the failed bit count in a memory block, the stronger the short. Accordingly, a fewer number of erase cycles can be used to confirm whether the memory block includes the targeted type of short.

Additionally, the controller 104 can set the number of erase cycles based on overall cycling of the drive. The higher the number of cycles (e.g., P/E cycles) performed on the drive the stronger the short in respective memory blocks that include the targeted type of short. Accordingly, fewer erase cycles can be used to confirm whether the memory block includes the targeted type of short. Thus, for a given point in time, after the controller 104 identifies a suspect memory block and determines to perform the confirmation process on the suspect memory block—the higher the number of cycles previously performed on the drive, the fewer erase cycles performed by the controller 104. Additionally, the controller 104 can set the number of erase cycles based on a result of a write operation. The higher the number of errors during the write operation, the fewer erase cycles performed by the controller 104.

Thus, in FIG. 4B, the controller 104 sets the number of erase cycles to perform, and also sets a level of the erase cycles by modifying parameters including an erase voltage parameter, an erase verify parameter, and a number of bits to be ignored. Results of performing the confirmation process include pass or fail. A result of performing the confirmation process is pass if all erase cycles were successful. A result of performing the confirmation process is fail if one or more erase cycles failed during the confirmation process. Thus, after performing the confirmation process 450, the controller 104 confirms the memory block 302-0 either has the targeted type of short or does not.

If all the erase cycles performed during the confirmation process 450 resulted in pass, then the controller 104 determines the memory block 302-0 does not have the targeted type of short. Various steps taken by the controller 104 at this point can include: moving the relocated data (e.g., moved prior to performing the confirmation process) back to the memory block 302-0; marking the memory block 302-0 as one that does not include the targeted type of short; tracking a number of times the confirmation process has been performed on the memory block 302-0; and refraining from marking the memory block 302-0 for garbage collection.

If one or more erase cycles performed during the confirmation process 450 resulted in fail, then the controller 104 determines the memory block 302-0 has the targeted type of short. Steps taken by the controller 104 at this point can include: marking the memory block 302-0 for garbage collection or marking the memory block 302-0 in a way that indicates the memory block 302-0 includes the targeted type of short.

The example described in FIGS. 4A and 4B refers to a memory block. Although a memory block has been used in the foregoing example, the example is not meant to be limiting. For example, the described methods can be applied to other units of memory such as a meta block. As used herein, a meta block includes a group of multiple blocks that are located in one or more memory dies that are processed together as if they were a single large block. In one example of a meta block, the memory 110 includes a die 0, a die 1, a die 2, a die 3, a die 4, a die 5, a die 6, and a die 7. The use of eight memory dies is not meant to be limiting, and in other implementation, more than or fewer than eight memory dies are used. Each of the example memory dies includes one or more memory blocks, and each of the memory blocks include multiple memory cells. A first set of die, including die 0, die 1, die 2, and die 3, is logically grouped to form a first meta plane, while a second set of die, including die 4, die 5, die 6, and die 7 is logically grouped to form a second meta plane. In this example, the meta block includes a group of multiple blocks that are located in memory dies of the same meta plane that are processed together as if they were a single large block.

Figure 5:
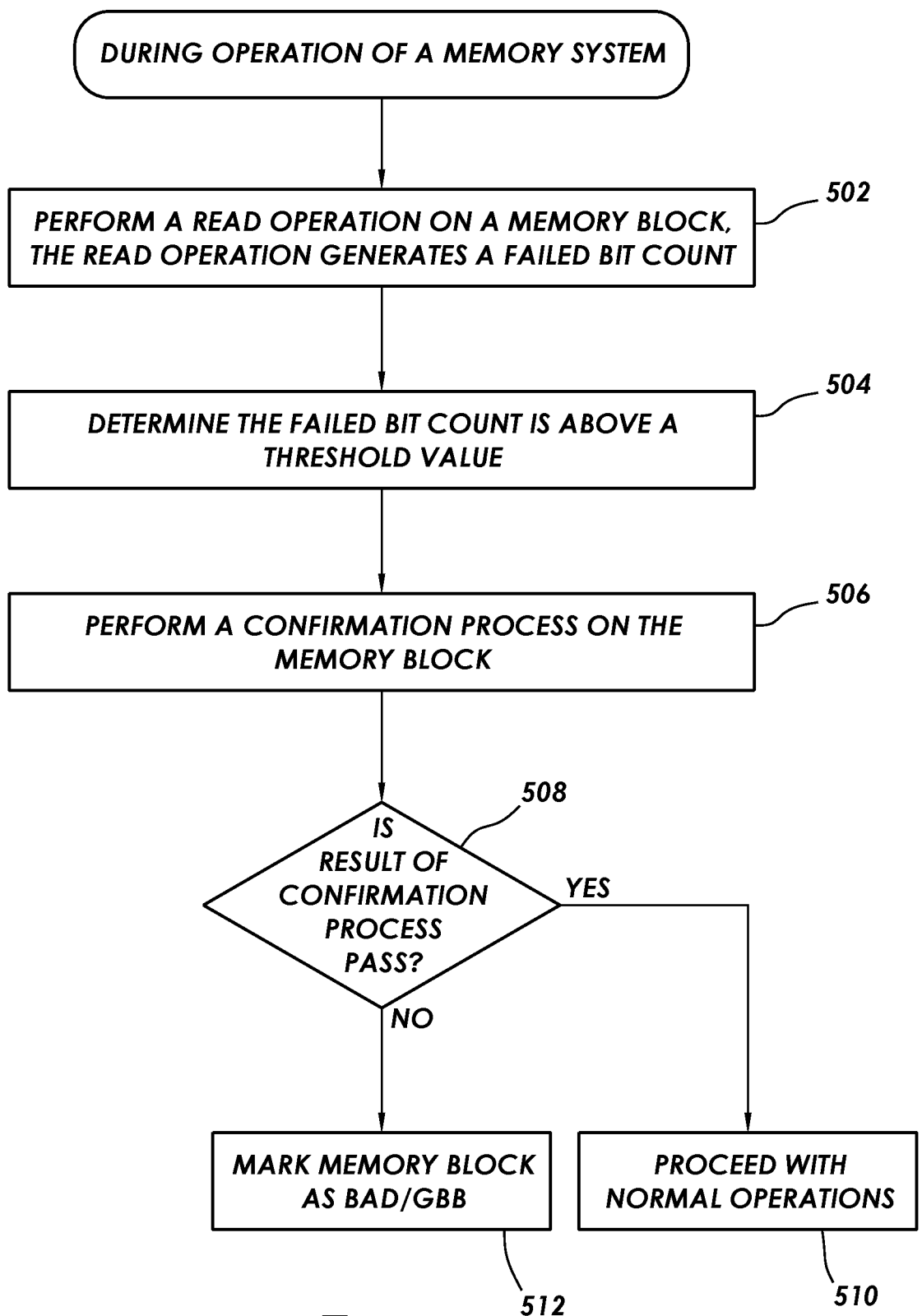
FIG. 5 illustrates a method diagram, in accordance with some embodiments.

FIG. 5 shows a method in accordance with at least some embodiments. In particular, the method is performed at a memory system (e.g., the storage system 102) and includes performing a read operation on a memory block where the read operation generates a failed bit count (block 502). Next the memory system determines the failed bit count is above a threshold value (block 504); and proceeds to perform a confirmation process on the memory block (block 506). The memory system determines a result of the confirmation process (decision block 508). If the result of the confirmation process is pass, the memory system proceeds with normal operations (block 510). If the result of the confirmation process is fail, the memory system marks the memory block as bad (block 512). Thereafter the method ends.

Figure 6:
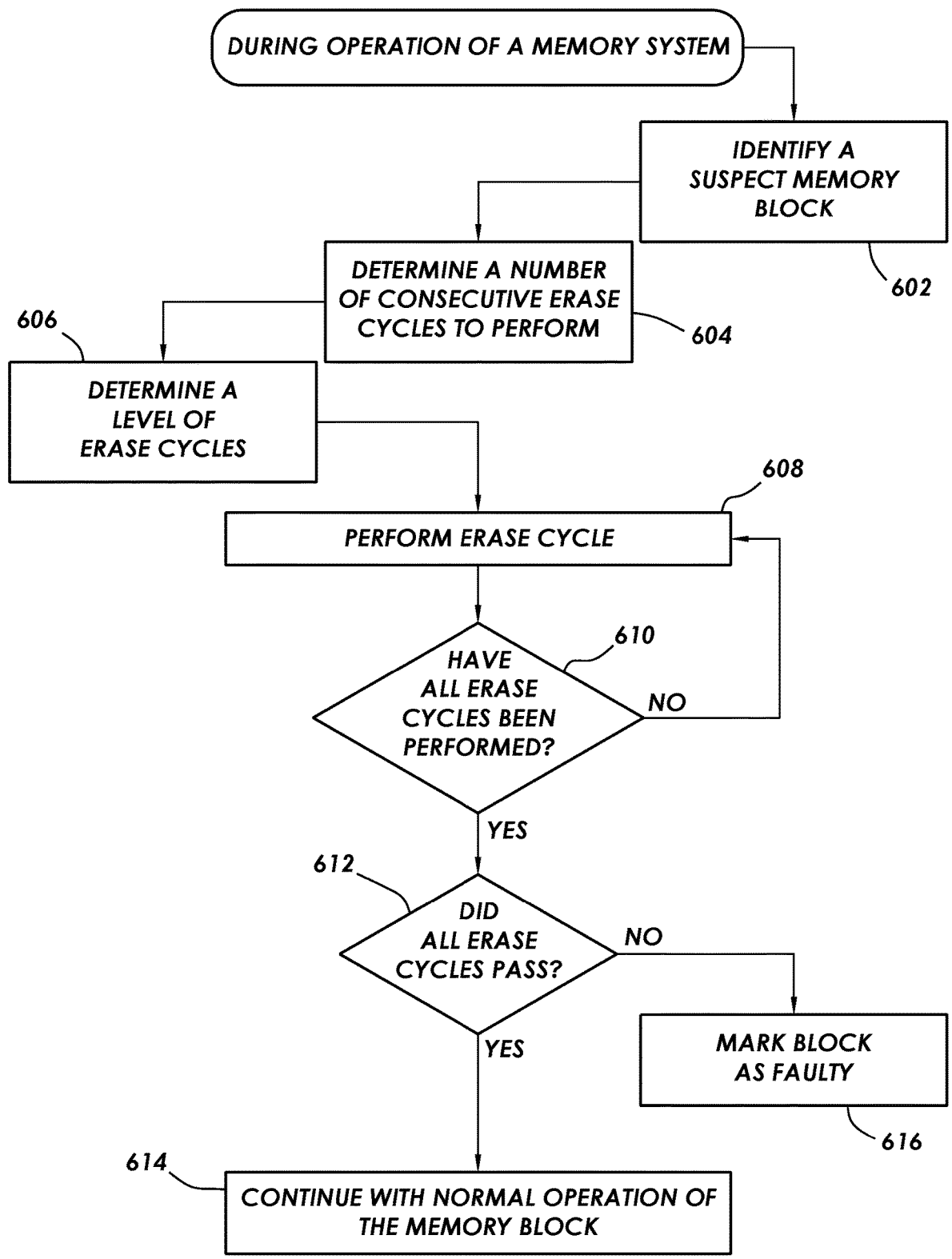
FIG. 6 illustrates a method diagram, in accordance with some embodiments.

FIG. 6 shows a method in accordance with at least some embodiments. In particular, the method is performed during operation of a memory system (e.g., the storage system 102) and includes identifying a suspect memory block (block 602). The memory system can identify a suspect memory block by performing the example method described in FIG. 5. After identifying a suspect memory block, the memory system determines a number of consecutive erase cycles to perform (block 604) and a level or erase cycles (block 606). Next, the memory system performs an erase cycle (block 608) and determines whether all erase cycles have been performed (block 610).

The memory system references the number of consecutive erase cycles determined in block 604 to determine whether all erase cycles have been performed during the confirmation process. If the memory system determines not all erase cycles have been performed, the memory system continues to perform erase cycles (blocks 610 and 608). If the memory system determines all the erase cycles have been performed, the memory system determines whether all erase cycles passed (decision block 612). If all erase cycles passed, the memory system continues with normal operation of the block (block 614). Otherwise, if the memory system determines a result of one or more erase cycles is fail, the memory system marks the memory block as faulty (block 616). In one example, the memory system designates the memory block for garbage collection.

The above discussion is meant to be illustrative of the principles and various embodiments described herein. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A storage system, configured to detect a faulty block in a memory array during operation of the storage system, comprising:
    the memory array; and
    a controller coupled to the memory array, wherein the controller is configured to:
        perform a read operation on a memory block of the memory array, the read operation generating a failed bit count;
        determine the failed bit count is above a value associated with an overall failed bit count;
        determine the failed bit count is above a threshold value, the threshold value based on an initial failed bit count; and
        in response to the failed bit count being above the threshold value;
            perform a confirmation process on the memory block, the confirmation process defining a number of consecutive erase cycles and a level of an erase cycle, and the confirmation process resulting is in erase pass or erase fail; and
            mark the memory block for garbage collection in response to determining the confirmation process results in erase fail.

2. The storage system of claim 1, wherein the controller is further configured to set the level of the erase cycle by modifying at least one selected from a group comprising: an erase voltage parameter, an erase verify parameter, and a number of bits ignored during the erase cycle.

3. The storage system of claim 1, wherein the number of the consecutive erase cycles is determined based on at least one selected from a group comprising: a difference in value between the overall failed bit count and an initial failed bit count; a number of erase cycles performed on the memory system; and a result of a flash write.

4. The storage system of claim 1, wherein the controller is further configured to, prior to performing the number of consecutive erase cycles, move data stored on the memory block to a different location in the memory system.

5. A storage system, configured to detect a faulty block in a memory array during operation of the storage system, comprising:
the memory array; and
a controller coupled to the memory array, wherein the controller is configured to:
perform a read operation on a memory block of the memory array, the read operation generating a failed bit count;
determine the failed bit count is above a value associated with an overall failed bit count;
determine the failed bit count is above a threshold value;
in response to the failed bit count being above the threshold value;
perform a confirmation process on the memory block, the confirmation process defining a number of consecutive erase cycles and a level of an erase cycle, and the confirmation process resulting in erase pass or erase fail; and
mark the memory block for garbage collection in response to determining the confirmation process results in erase fail; and
update, based on the failed bit count, the value associated with the overall failed bit count, wherein the value associated with the overall failed bit count is a median failed bit count.

6. A method for detecting a faulty block in a memory system during operation of the memory system, comprising:
performing a read operation on a memory block, the read operation generating a failed bit count;
determining the failed bit count is above a threshold value; and
in response to the failed bit count being above the threshold value:
performing a confirmation process on the memory block, the confirmation process defining a level of an erase cycle, and the confirmation process resulting in erase pass or erase fail; and
marking the memory block for garbage collection in response to determining the confirmation process results in erase fail;
wherein the number of the consecutive erase cycles is determined based on at least one selected from a group comprising: a different in value between the overall failed bit count and an initial failed bit count; a number of erase cycles performed on the memory system; and a result of a flash write.

7. The method of claim 6, further comprising setting the level of the erase cycle by modifying at least one selected from a group comprising: an erase voltage parameters; an erase verify parameter; and a number of bits ignored during the erase cycle.

8. The method of claim 6, further comprising, prior to the performing the confirmation process, moving data stored on the memory block to a different location in the memory system.

9. The method of claim 6, further comprising determining the failed bit count is above a median failed bit count.

10. The method of claim 6, further comprising:
performing a second read operation on a second memory block, the second read operation generating a second failed bit count;
determining, the second failed bit count is above a second value associated with an overall failed bit count;
determining the second failed bit count is above a second threshold value; and
in response to the second failed bit count being above the second threshold value:
performing the confirmation on the second memory block; and
refraining from marking the second memory block for garbage collection, in response to determining the confirmation process results in erase pass.

11. A memory controller, comprising:
a first terminal configured to couple to a memory array, the memory controller configured to:
perform a read operation on a memory block, the read operation generating a failed bit count;
determine the failed bit count is above a threshold value; and
in response to the failed bit count being above the threshold value:
perform a confirmation process on the memory block, the confirmation process defining a level of an erase cycle, and the confirmation process resulting in erase pass or erase fail; and
mark the memory block for garbage collection in response to determining the confirmation process results in erase fail;
wherein the level of the erase cycle is determined based on at least one selected from a group comprising: a difference in value between the overall failed bit count and an initial failed bit count; a number of program and erase cycles performed on the memory system; and a result of a flash write.

12. The memory controller of claim 11, further configured to set the level of the erase cycle by modifying at least one selected from a group comprising: an erase voltage parameter, an erase verify parameter, and a number of bits ignored during the erase cycle.

13. The memory controller of claim 11, further configured to determine the failed bit count is above a median failed bit count.

14. The memory controller of claim 11, further configured to, prior to performing the confirmation process, move data stored on the memory block to a different location in the memory array.

15. The memory controller of claim 11, further configured to:
perform, a second read operation on a second memory block, the second read operation generating a second failed bit count;
determine the second failed bit count is above a second median failed bit count;
determine the second failed bit count is above a second threshold value; and
in response to the second failed bit count being above the second threshold value:

perform the confirmation process on the second memory block; and operate the second memory block using normal operating conditions, in response to a determination that the confirmation process results in erase pass.

16. The memory controller of claim 11, wherein when the memory controller performs the confirmation process, the memory controller further, performs a number of consecutive erase cycles on the memory block.

* * * * *